(12) United States Patent
Shen et al.

(10) Patent No.: US 9,015,541 B2
(45) Date of Patent: Apr. 21, 2015

(54) DEVICE AND METHOD FOR PERFORMING TIMING ANALYSIS

(71) Applicant: Test Research, Inc., Taipei (TW)

(72) Inventors: Yu-Chen Shen, Taipei (TW); Yi-Hao Hsu, Taipei (TW)

(73) Assignee: Test Research, Inc., Taipei (TW)

( * ) Notice: Subject to any disclaimer, the term of this patent is extended or adjusted under 35 U.S.C. 154(b) by 161 days.

(21) Appl. No.: 13/798,879

(22) Filed: Mar. 13, 2013

(65) Prior Publication Data
US 2014/0201581 A1 Jul. 17, 2014

(30) Foreign Application Priority Data

Jan. 17, 2013 (TW) .............................. 102101773 A

(51) Int. Cl.
*G01R 31/28* (2006.01)
*G01R 31/319* (2006.01)
*G01R 31/3193* (2006.01)

(52) U.S. Cl.
CPC ...... *G01R 31/3191* (2013.01); *G01R 31/31937* (2013.01)

(58) Field of Classification Search
CPC ................. G01R 31/31937; G01R 31/318513; G01R 31/31858; G01R 31/3191; G01R 31/31917
USPC ................. 714/725; 324/762.02, 73.1, 756.02
See application file for complete search history.

(56) References Cited

U.S. PATENT DOCUMENTS

| 5,644,261 | A | * | 7/1997 | Frisch et al. | 327/277 |
| 6,799,127 | B1 | * | 9/2004 | Sontag et al. | 702/68 |
| 7,373,621 | B1 | * | 5/2008 | Dastidar | 714/726 |
| 2003/0206021 | A1 | * | 11/2003 | Laletin et al. | 324/426 |
| 2007/0162800 | A1 | * | 7/2007 | Tanaka | 714/724 |

* cited by examiner

*Primary Examiner* — Guy Lamarre
(74) *Attorney, Agent, or Firm* — McDermott Will & Emery LLP

(57) ABSTRACT

A device for performing timing analysis used in a programmable logic array system is provided. The device comprises first and second basic I/O terminals, a channel multiplexer, high-speed I/O terminals, a sampling module and a timing analysis module. The first basic I/O terminals receive under-test signals from an under-test unit. The channel multiplexer receives the under-test signals from the first basic I/O terminals to select at least a group of the under-test signals to be outputted to the second basic I/O terminals. The high-speed I/O terminals has a logic level analyzing speed higher than that of the first and second basic I/O terminals. The sampling module receives the group of under-test signals from the high-speed I/O terminals and samples the group of under-test signals to generate a sample result. The timing analysis module performs timing analysis and measurement according to the sample result.

14 Claims, 4 Drawing Sheets

DEVICE AND METHOD FOR PERFORMING TIMING ANALYSIS

RELATED APPLICATIONS

This application claims priority to Taiwan Application Serial Number 102101773, filed Jan. 17, 2013, which is herein incorporated by reference.

BACKGROUND

1. Technical Field

The present disclosure relates to a timing analysis technology. More particularly, the present disclosure relates to a device and a method for performing timing analysis used in a programmable logic array system.

2. Description of Related Art

In automatic test equipment (ATE) systems, the measurement of the timing is important. The common targets of the timing measurement include the pulse width, the rise time, the fall time, the frequency and skew of the waveform of signals of an under-test module. When the signals of the under-test module are not outputted correctly, a calibration can be made according to the measured timing information such that the function of the under-test module is not affected by the incorrect timing of the signals.

In the conventional timing measurement technology, delay elements connected in series are used to delay the signal such that an analyzing module perform the timing measurement according to the delay result of these delay elements. When the device such as the programmable logic array is used to implement the timing measurement system, the routing area becomes too large when lots of delay elements are used. When the delayed signals generated from the delay elements are sent to the analyzing module, there are lots of issues that may decrease the accuracy of the measurement result due to the large routing area. For example, the distances from each of the delay elements to the analyzing module large routing area are not the same. Further, the routings of different channels are different as well.

On the other hand, in parts of the conventional technologies, the signals are sampled by high speed I/O interface of the logic programmable array. Though the accuracy of the measurement result is high, the number of the channels is limited. For most of the ATE systems, it is necessary to be equipped with lots of signal input channels to perform the timing measurement efficiently.

Accordingly, what is needed is a device and a method for performing timing analysis used in a programmable logic array system to avoid the error generated due to the large routing area and increase the accuracy of the measurement result.

SUMMARY

An aspect of the present invention is to provide a device for performing timing analysis used in a programmable logic array system. The device comprises a plurality of first basic I/O terminals, a plurality of second basic I/O terminals, a channel multiplexer, a plurality of high-speed I/O terminals, a sampling module and a timing analysis module. The first basic I/O terminals receive a plurality of under-test signals from an under-test unit. The channel multiplexer receives the under-test signals from the first basic I/O terminals to select at least a group of the under-test signals to be outputted to the second basic I/O terminals. The high-speed I/O terminals have a logic level analyzing speed higher than that of the first and second basic I/O terminals and are connected to the second basic I/O terminals. The sampling module receives the group of under-test signals outputted from the second basic I/O terminals through the high-speed I/O terminals and to sample the group of under-test signals to generate a sample result. The timing analysis module performs a timing analysis and measurement according to the sample result.

Another aspect of the present invention is to provide a method for performing timing analysis used in a device for performing timing analysis in a programmable logic array system. The method comprises the steps outlined below. A plurality of under-test signals from an under-test unit are received to a plurality of first basic I/O terminals. The under-test signals are received from the first basic I/O terminals to a channel multiplexer to select at least a group of the under-test signals to be outputted to a plurality of second basic I/O terminals. The group of under-test signals outputted from the second basic I/O terminals are received through a plurality of high-speed I/O terminals to sample the group of under-test signals to generate a sample result, wherein the high-speed I/O terminals have a logic level analyzing speed higher than that of the first and second basic I/O terminals. A timing analysis and measurement is performed according to the sample result.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
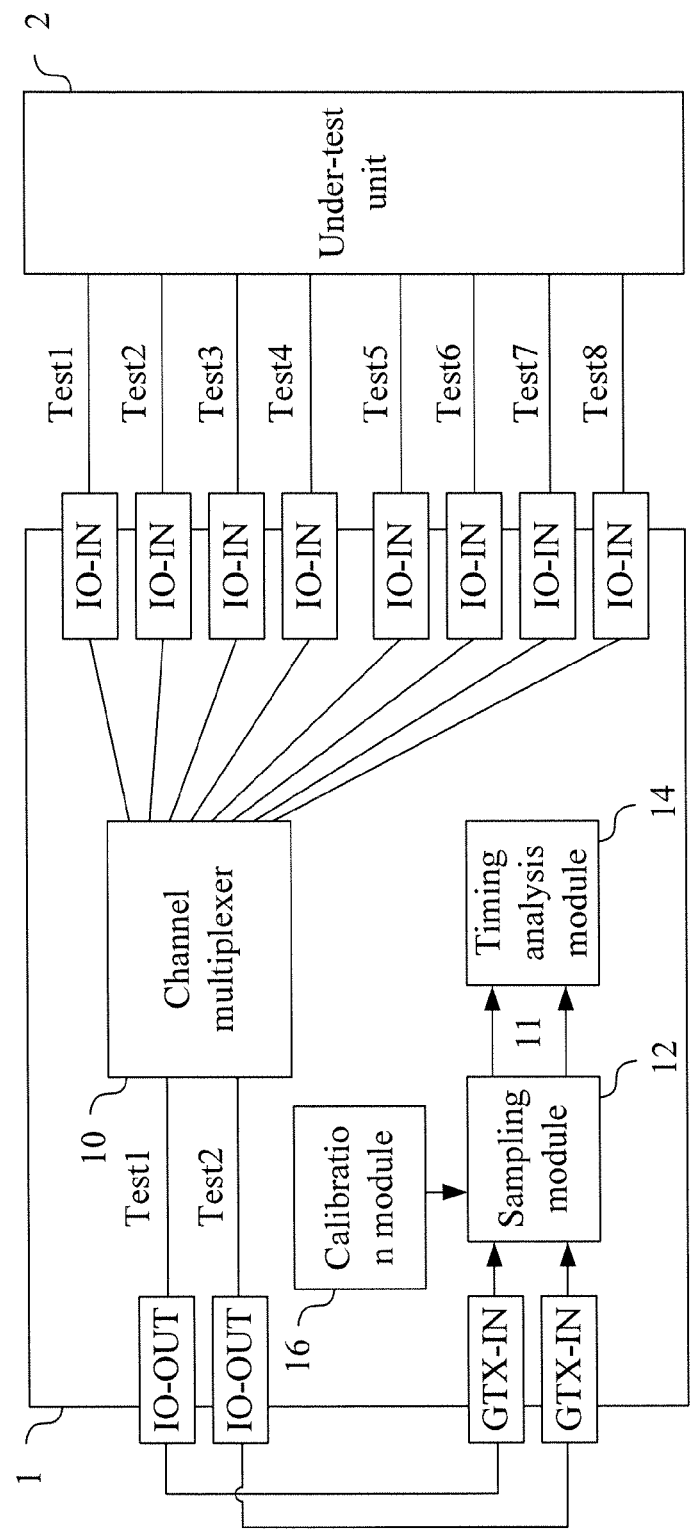
FIG. 1 is a block diagram of a device for performing timing analysis in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a block diagram of a device 1 for performing timing analysis in an embodiment of the present invention. The device 1 can be used in a programmable logic array system. The device 1 comprises a plurality of first basic I/O terminals IO-IN, a plurality of second basic I/O terminals IO-OUT, a channel multiplexer 10, a plurality of high-speed I/O terminals GTX-IN, a sampling module 12 and a timing analysis module 14.

In the present embodiment, each of the first basic I/O terminals IO-IN and the second basic I/O terminals IN-OUT is a basic input/output end of the programmable logic array system, and the logic level analyzing speed of each of the first basic I/O terminals and the second basic I/O terminals is at most 200 MHz. In the present embodiment, the first basic I/O terminals IO-IN serve as the input ends to receive a plurality of under-test signals Test1, Test2, . . . and Test8 from an under-test unit 2. It is noted that the number of the first basic I/O terminals IO-IN shown in FIG. 1 is eight. However, in other embodiments, the number of the first basic I/O terminals IO-IN is not limited by the present embodiment.

The channel multiplexer 10 receives the under-test signals Test1, Test2, . . . and Test8 from the first basic I/O terminals IO-IN to select at least a group of the under-test signals to be outputted to the second basic I/O terminals IO-OUT. In the present embodiment, the second basic I/O terminals IO-OUT serve as the output ends to output a group of under-test signals Test1 and Test2. It is noted that the number of the second basic I/O terminals IO-OUT shown in FIG. 1 is two. However, in other embodiments, the number of the second basic I/O terminals IO-OUT is not limited by the present embodiment.

Each of the high-speed I/O terminals GTX-IN has a logic level analyzing speed higher than that of the first and second basic I/O terminals IO-IN and IO-OUT. In the present embodiment, the logic level analyzing speed of the high-speed I/O terminals GTX-IN is at least five times faster than that of the first and second basic I/O terminals IO-IN and IO-OUT. Each of the high-speed I/O terminals GTX-IN can be, but not limited to, a peripheral component interconnect express (PCI-E) I/O port or a universal serial bus (USB) 3.0 I/O port and can have the logic level analyzing speed up to at least 1 GHz. The high-speed I/O terminals GTX-IN are connected to the second basic I/O terminals IO-OUT.

The sampling module 12 receives the group of under-test signals Test1 and Test2 outputted from the second basic I/O terminals IO-OUT through the high-speed I/O terminals GTX-IN and samples the group of under-test signals Test1 and Test2 to generate a sample result 11. In an embodiment, the sampling module 12 is a high speed serial to low speed parallel sampling module. The equivalent sampling rate does not change. Further, the low speed parallel port is preferable in the subsequent digital timing measurement process. For example, if the frequency of the under-test signal Test1 is 10 GHz, the sampling module 12 can downsample the signal such that the frequency of the signal becomes 100 MHz, and the original 1 bit sequential signal is converted to be a 100-bit parallel signal.

Since the sampling of the under-test signals Test1 and Test2 is performed by the high-speed I/O terminals GTX-IN, the accuracy of the sampling result 11 is much higher than the sampling process performed by common I/O ports. The timing analysis module 14 can perform a timing analysis and measurement according to the sample result 11.

Figure 2:
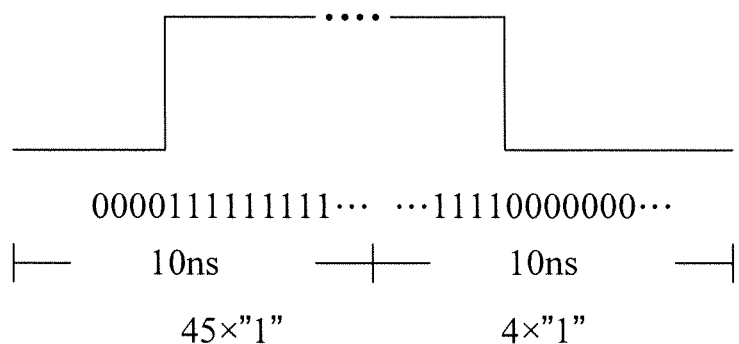
FIG. 2 is a waveform diagram of the under-test signal in an embodiment of the present invention.

FIG. 2 is a waveform diagram of the under-test signal in an embodiment of the present invention. For example, if the sampling result 11 shows that 100 sample values are generated during 20 nanoseconds (ns) from the beginning to the end of the sampling process as depicted in FIG. 2, in which 49 values of them are 1, the measured pulse width of this waveform is 49×(20 n/100)=49×0.2 n.

Accordingly, by setting the time interval between the beginning and end of the measuring process, the timing analysis module 14 can perform accurate timing analysis and measurement according to the sample values within the time interval.

Figure 3:
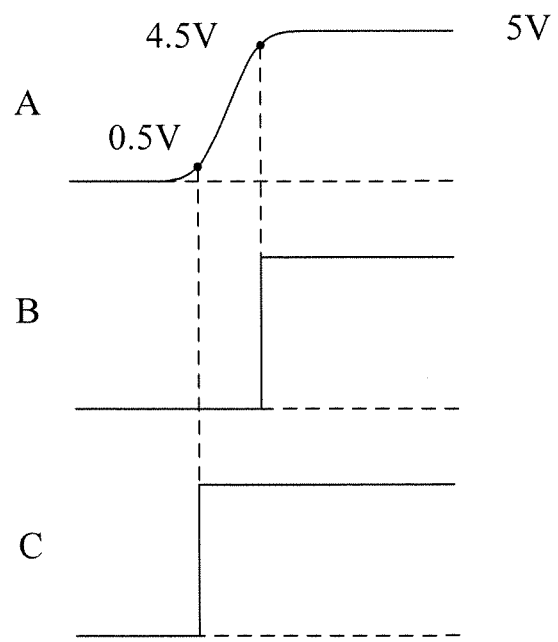
FIG. 3 is a waveform diagram of the under-test signal and the related measuring signals in an embodiment of the present invention.

FIG. 3 is a waveform diagram of the under-test signal and the related measuring signals in an embodiment of the present invention. In the present embodiment, if the rise time of an under-test signal A is supposed to be measured, the under-test signal A can be sent to two different channels such that the output signals of the two channels are compared in two comparators (not shown), in which the reference voltage of one comparator is set to 90% of the maximum voltage of the under-test signal and the reference voltage of other comparator is set to 10% of the maximum voltage of the under-test signal. For example, if the maximum voltage of the under-test signal is 5V, the reference voltage of one comparator is set to 4.5V and the reference voltage of other comparator is set to 0.5V. After the comparison, the comparators generate the compared signals B and C as shown in FIG. 3. Subsequently, the number of 0 and 1 of the sample values of the compared signals B and C can be counted (similar to the method shown in FIG. 2) such that the timing analysis module 14 can calculate the difference between the two compared signals B and C to measure and analyze the rise time of the under-test signal A.

In the above description, only the pulse width and the rise time are used as examples. In other embodiments, the timing analysis module 14 can perform the measure and analysis of the parameters such as, but not limited to, the fall time, the frequency and the skew of the waveform.

Please refer back to FIG. 1. After the measurement of the group of under-test signals Test1 and Test2, the channel multiplexer 10 can select other group of under-test signals, such as Test3 and Test4 to perform measurement and analysis. Hence, the channel multiplexer 10 of the present embodiment can dynamically select the under-test signals in different channels to perform measurement in turn while the number of the high-speed I/O terminals GTX-IN is limited.

It is noted that, the number of the high-speed I/O terminals GTX-IN of the device 1 can be adjusted according to different applications. For example, if eight high-speed I/O terminals GTX-IN are used, at most eight under-test signals corresponding to eight second basic I/O terminals IO-OUT can be received such that more under-test signals can be measured and analyzed at the same time after the sampling process made by the sampling module 12.

In conventional design, a plurality stages of delay elements connected in series are used to perform the timing measurement and analysis. Therefore, the accuracy of the measurement is affected by the routing length and the routing area. Further, in a multiple channels design, it is difficult to make the signal transmission path of each channel equal due to the routing issue. Differential non-linear error and integral non-linear error are thus generated due to the presence of the effect described above. By using the device in the present invention, the complicated routing of the large amount of delay elements can be avoided. Further, the accuracy of 200 picoseconds (ps) to 35 ps can be accomplished by using the high-speed I/O terminals having the logic level analyzing speed in the range of about 5 GHz to 28 GHz. Furthermore, the issue of the limited number of the high-speed I/O terminals can be overcome by the channel multiplexer. The under-test signals in different channels can be dynamically selected to realize the measurement of the signals in multiple channels.

However, the signal transmission paths from each of the first basic I/O terminals IO-IN to the channel multiplexer 10 may be different due to the different length of routing or the different path length in the pin board. Further, the signal transmission paths from each of the second basic I/O terminals IO-OUT to the channel multiplexer 10 may be different too. Therefore, when signals in two channels are used to perform the measurement, as shown in FIG. 3, an error is generated due to the mismatch of the path latency of the two channels.

Therefore, in the present embodiment, the device 1 can further comprises a calibration module 16. In the present embodiment, the calibration module 16 stores a timing calibration table (not shown). Before the actual measurement procedure, a calibration process can be made by sending the same under-test signal to two channels from any two of the first basic I/O terminals IO-IN to the channel multiplexer 10 and to two channels from the channel multiplexer 10 to any two of the second basic I/O terminals IO-OUT such that the difference of the sampling result of the two channels can be recorded by the sampling module 12 in the timing calibration table.

After recording the timing difference (i.e. the path latency) between each two of the channels, the device 1 can perform timing calibration according to the sampling result of the sampling module 12 in the measurement procedure. For example, if two identical signals that switch from a low level to a high level are transmitted to two channels respectively at the same time during the calibration process and the level-switching time of the signal in the second channel is 0.3 ns later than the level-switching time of the signal in the first channel, the device 1 can delay the sampling result in the first channel for 0.3 ns during the actual measurement procedure according to the timing calibration table to compensate the mismatch of the timing between the two channels.

Figure 4:
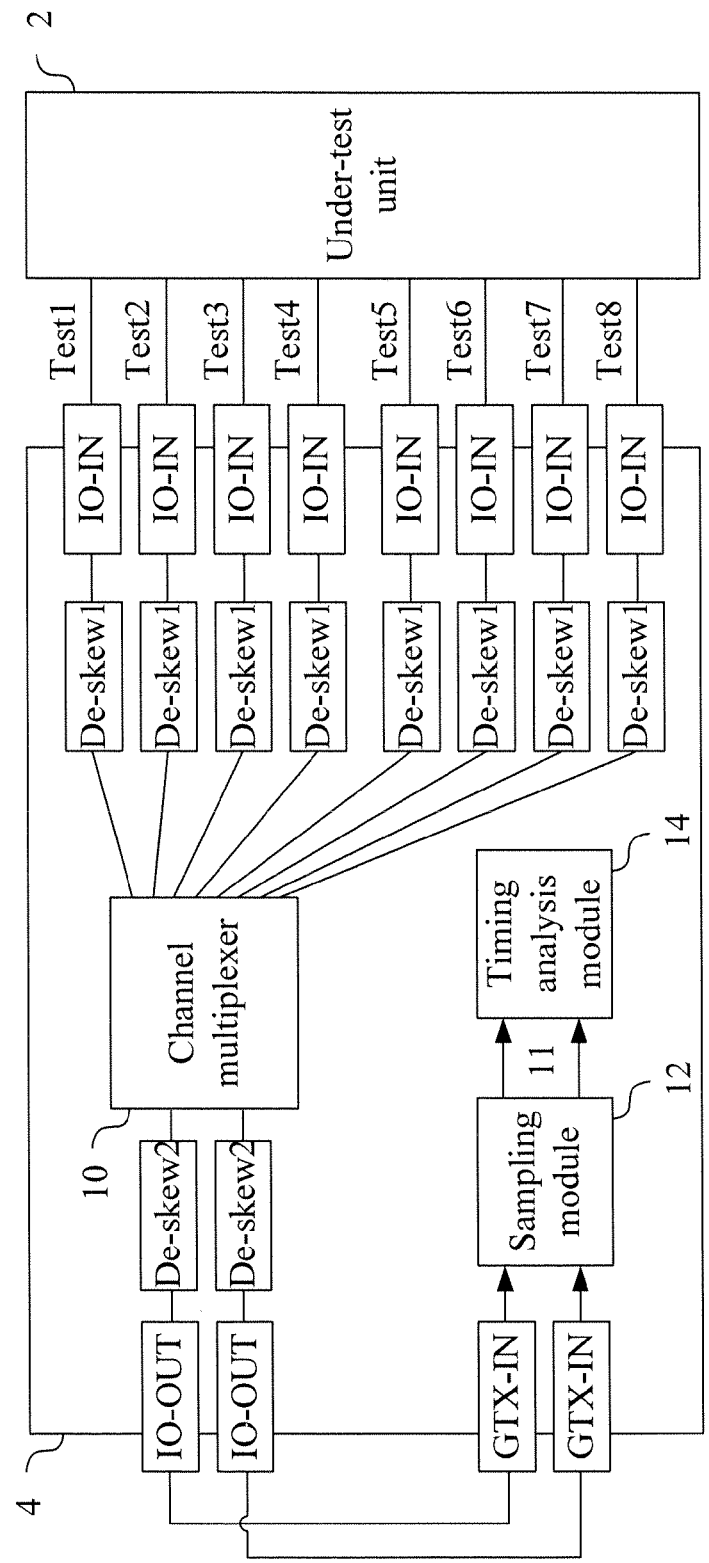
FIG. 4 is a block diagram of a device for performing timing analysis in an embodiment of the present invention.

FIG. 4 is a block diagram of a device 4 for performing timing analysis in an embodiment of the present invention. The device 4 is generally similar to the device 1 depicted in FIG. 1. Hence, the identical elements are not described in detail here. In the present embodiment, the device 4 further comprises a plurality of first timing calibration modules De-skew1 and a plurality of second timing calibration modules De-skew2.

Each of the first timing calibration modules De-skew1 is connected between one of the first basic I/O terminals IO-IN and the channel multiplexer 10. Each of the second timing calibration modules De-skew2 is connected between one of the second basic I/O terminals IO-OUT and the channel multiplexer 10. In the present embodiment, each of the first timing calibration modules De-skew1 and the second basic I/O terminals IO-OUT is a delay element.

Similarly, the timing calibration information, i.e. the difference of the sampling result sampled by the sampling module 12 between two channels, can be obtained by sending the same under-test signal device 4 to two channels from any two of the first basic I/O terminals IO-IN to the channel multiplexer 10 and to two channels from the channel multiplexer 10 to any two of the second basic I/O terminals IO-OUT. After obtaining the timing difference between each two channels, the first timing calibration modules De-skew1 and the second timing calibration modules De-skew2 can be programmed to compensate the timing difference such that every channel has the same signal transmission time.

For example, if two identical signals that switch from a low level to a high level are transmitted to two channels respectively at the same time during the calibration process and the level-switching time of the signal in the second channel is 0.3 ns later than the level-switching time of the signal in the first channel, the first timing calibration modules De-skew1 and/or the second timing calibration modules De-skew2 can be programmed such that the signal in the first channel is delayed to make the timing of the sampling results of the two channels become the same. Therefore, the device 1 does not need to calibrate the sampling result during the actual measurement procedure since the timing difference is calibrated during the transmission of the signals. The sampling result can be measured and analyzed directly.

Accordingly, the device 1 of the present invention can realize multi-channel signal analysis and measurement by using the programmable logic array system with limited number of high-speed I/O terminals. Further, the calibration mechanism performed on the signals between different channels can increase the accuracy of both the sampling result and the measurement result.

Figure 5:
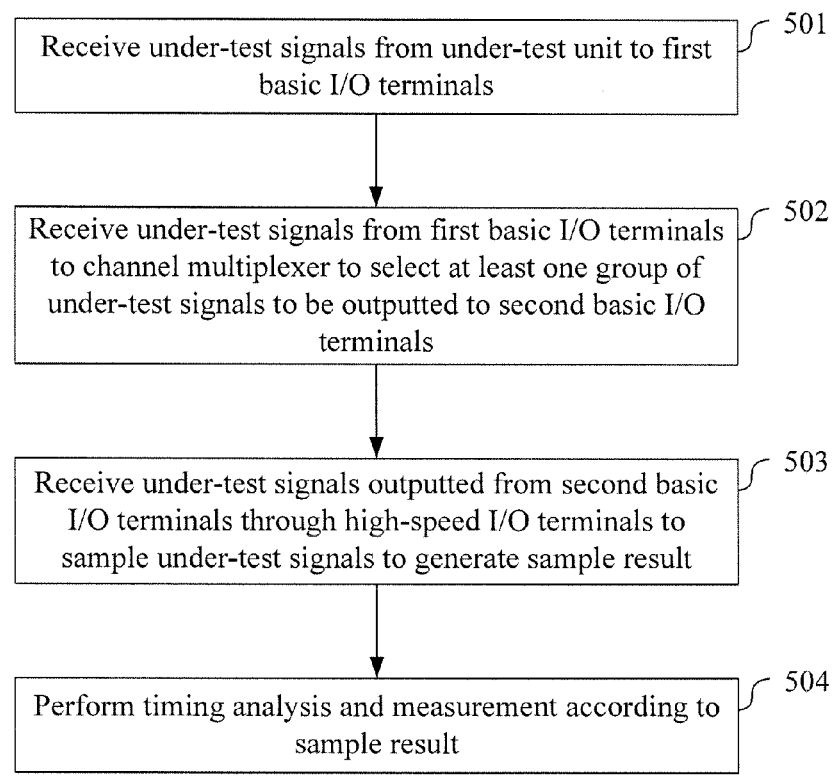
FIG. 5 is a flow chart of a method for performing timing analysis in an embodiment of the present invention.

FIG. 5 is a flow chart of a method 500 for performing timing analysis in an embodiment of the present invention. The method 500 can be used in the device 1 for performing timing analysis depicted in FIG. 1. The method 500 comprises the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 501, a plurality of under-test signals from an under-test unit 2 are received to a plurality of first basic I/O terminals IO-IN.

In step 502, the under-test signals are received from the first basic I/O terminals IO-IN to a channel multiplexer 10 to select at least a group of the under-test signals to be outputted to a plurality of second basic I/O terminals IO-OUT.

In step 503, the group of under-test signals outputted from the second basic I/O terminals IO-OUT are received through a plurality of high-speed I/O terminals GTX-IN to the sampling module 12 sample the group of under-test signals to generate a sample result, wherein the high-speed I/O terminals GTX-IN have a logic level analyzing speed higher than that of the first and second basic I/O terminals IO-IN and IO-OUT.

In step 504, a timing analysis and measurement is performed according to the sample result.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A device for performing timing analysis used in a programmable logic array system comprising:
   a plurality of first basic I/O circuits to receive a plurality of under-test signals from an under-test unit;
   a plurality of second basic I/O circuits;
   a channel multiplexer to receive the under-test signals from the first basic I/O circuits to select at least a group of the under-test signals to be outputted to the second basic I/O circuits;
   a plurality of high-speed I/O circuits having a logic level analyzing speed higher than that of the first and second basic I/O circuit, wherein the high-speed I/O circuits are connected to the second basic I/O circuits;
   a sampling module to receive the group of under-test signals outputted from the second basic I/O circuits through the high-speed I/O circuits and to sample the group of under-test signals to generate a sample result; and
   a timing analysis module to perform a timing analysis and measurement according to the sample result.

2. The device of claim 1, wherein the logic level analyzing speed of the first basic I/O circuits and the second basic I/O circuits is at most 200 MHz.

3. The device of claim 1, wherein the logic level analyzing speed of the high-speed I/O circuits is at least 1 GHz.

4. The device of claim 1, further comprising a calibration module to store a timing calibration table such that the timing analysis module performs the timing analysis and measurement after the timing analysis module performs a timing calibration on the sample result of under-test signals according to the timing calibration table.

5. The device of claim 4, wherein the timing calibration table records a path latency difference between any two of the first basic I/O circuits and the channel multiplexer and between any two of the second basic I/O circuits and the channel multiplexer.

6. The device of claim 1, further comprising:
a plurality of first timing calibration modules each connected between one of the first basic I/O circuits and the channel multiplexer; and
a plurality of second timing calibration modules each connected between one of the second basic I/O circuits and the channel multiplexer, in which the first timing calibration modules and the second timing calibration modules perform a timing calibration on the under-test signals according to a timing calibration information.

7. The device of claim 6, wherein the timing calibration information is a path latency difference between any two of the first basic I/O circuits and the channel multiplexer and between any two of the second basic I/O circuits and the channel multiplexer.

8. The device of claim 6, wherein each of the first timing calibration modules and the second timing calibration modules is a delay element.

9. The device of claim 1, wherein the sampling module is a high speed serial to low speed parallel sampling module.

10. A method for performing timing analysis used in a device for performing timing analysis in a programmable logic array system, wherein the method comprises:
receiving a plurality of under-test signals from an under-test unit to a plurality of first basic I/O circuits;
receiving the under-test signals from the first basic I/O circuits to a channel multiplexer to select at least a group of the under-test signals to be outputted to a plurality of second basic I/O circuits;
receiving the group of under-test signals outputted from the second basic I/O circuits through a plurality of high-speed I/O circuits to sample the group of under-test signals to generate a sample result, wherein the high-speed I/O circuits have a logic level analyzing speed higher than that of the first and second basic I/O circuits; and
performing a timing analysis and measurement according to the sample result.

11. The method of claim 10, further comprising performing the timing analysis and measurement after performing a timing calibration on the sample result of under-test signals according to a timing calibration table.

12. The method of claim 11, wherein the timing calibration table records a path latency difference between any two of the first basic I/O circuits and the channel multiplexer and between any two of the second basic I/O circuits and the channel multiplexer.

13. The method of claim 10, further comprising performing a timing calibration on the under-test signals according to a timing calibration information by a plurality of first timing calibration modules each connected between one of the first basic I/O circuits and the channel multiplexer and by a plurality of second timing calibration modules each connected between one of the second basic I/O circuits and the channel multiplexer.

14. The method of claim 13, wherein the timing calibration information is a path latency difference between any two of the first basic I/O circuits and the channel multiplexer and between any two of the second basic I/O circuits and the channel multiplexer.

* * * * *